(12) United States Patent
Zhang et al.

(10) Patent No.: US 11,652,147 B1
(45) Date of Patent: May 16, 2023

(54) METAL-SEMICONDUCTOR CONTACT STRUCTURE BASED ON TWO-DIMENSIONAL SEMIMETAL ELECTRODES

(71) Applicant: University of Science and Technology Beijing, Beijing (CN)

(72) Inventors: Yue Zhang, Beijing (CN); Xiankun Zhang, Beijing (CN); Zheng Zhang, Beijing (CN); Huihui Yu, Beijing (CN); Mengting Huang, Beijing (CN); Wenhui Tang, Beijing (CN); Li Gao, Beijing (CN); Xiaofu Wei, Beijing (CN)

(73) Assignee: UNIVERSITY OF SCIENCE AND TECHNOLOGY BEIJING, Beijing (CN)

( * ) Notice: Subject to any disclaimer, the term of this patent is extended or adjusted under 35 U.S.C. 154(b) by 0 days.

(21) Appl. No.: 17/979,125

(22) Filed: Nov. 2, 2022

(30) Foreign Application Priority Data

Jan. 28, 2022 (CN) .......................... 202210107442.0

(51) Int. Cl.
*H01L 29/24* (2006.01)
*H01L 29/47* (2006.01)
(Continued)

(52) U.S. Cl.
CPC .......... *H01L 29/24* (2013.01); *H01L 29/0665* (2013.01); *H01L 29/40* (2013.01);
(Continued)

(58) Field of Classification Search
CPC ... H01L 21/743; H01L 29/0665; H01L 29/24; H01L 29/34; H01L 29/40; H01L 29/41; H01L 29/41725; H01L 29/43; H01L 29/47; H01L 29/7606; H01L 29/778; H01L 29/78; H01L 29/7839; H01L 29/786; H01L 31/002408; H01L 31/108; C23C 16/30; C23C 16/305
See application file for complete search history.

(56) References Cited

U.S. PATENT DOCUMENTS

| 6,144,546 A | 11/2000 | Mizushima |
| 2019/0378715 A1* | 12/2019 | Lin .................. H01L 21/02485 |
| 2021/0066511 A1 | 3/2021 | Im |

FOREIGN PATENT DOCUMENTS

| CN | 108630750 A | 10/2018 |
| CN | 109629004 A | 4/2019 |

(Continued)

*Primary Examiner* — Cheung Lee
(74) *Attorney, Agent, or Firm* — Mayer & Williams, PC; Stuart H. Mayer

(57) ABSTRACT

Disclosed is a metal-semiconductor contact structure based on two-dimensional (2D) semimetal electrodes, including a semiconductor module and a metal electrode module, where the semiconductor module is a 2D semiconductor material, and the metal electrode module is a 2D semimetal material with no dangling bonds on its surface; the 2D semiconductor material and the 2D semimetal material are interfaced with a Van der Waals interface with a surface roughness of 0.01-1 nanometer (nm) and no dangling bonds on the surface, the 2D semiconductor material and the 2D semimetal material are spaced less than 1 nm apart.

1 Claim, 5 Drawing Sheets

(51) Int. Cl.
  *H01L 29/76* (2006.01)
  *H01L 29/06* (2006.01)
  *H01L 29/40* (2006.01)
  *H01L 29/43* (2006.01)
  *H01L 29/78* (2006.01)
  *H01L 29/417* (2006.01)
  *H01L 31/0224* (2006.01)
  *H01L 21/74* (2006.01)

(52) U.S. Cl.
  CPC .............. *H01L 29/43* (2013.01); *H01L 29/47* (2013.01); *H01L 29/7606* (2013.01); *H01L 21/743* (2013.01); *H01L 29/41725* (2013.01); *H01L 29/7839* (2013.01); *H01L 31/022408* (2013.01)

(56) References Cited

FOREIGN PATENT DOCUMENTS

| | | |
|---|---|---|
| CN | 110190182 A | 8/2019 |
| CN | 113871453 A | 12/2021 |
| CN | 113972262 A | 1/2022 |

\* cited by examiner

METAL-SEMICONDUCTOR CONTACT STRUCTURE BASED ON TWO-DIMENSIONAL SEMIMETAL ELECTRODES

CROSS-REFERENCE TO RELATED APPLICATIONS

This application claims priority to Chinese Patent Application No. 202210107442.0, filed on Jan. 28, 2022, the contents of which are hereby incorporated by reference.

TECHNICAL FIELD

The present application relates to the technical field of metal-semiconductor, and in particular to a metal-semiconductor contact structure based on two-dimensional semimetal electrodes.

BACKGROUND

As feature sizes of transistors become small, the interference of the contact resistance at the metal-semiconductor interface becomes rather prominent, which further inhibits scaling of devices and performance as well. Especially for ultra-thin two-dimensional (2D) semiconductors, one of the main factors for poor contacts in metal/2D semiconductors is the large Schottky potential barrier. Disordered interfacial states and metal-induced gap states together lead to Fermi level pinning effects, because compared with contacts between metals and bulk semiconductors, ultra-thin 2D semiconductors make the metal-semiconductor interface more susceptible to the detrimental effects of lattice defects, interfacial trapping sites and chemical interactions.

In the prior art, Van der Waals contact of the metal electrode is transferred to suppress the Fermi level pinning effect in the metal/2D semiconductor interface in order to avoid such interfacial states during the thermal deposition of conventional metals, but the attenuated metal wave function from conventional metals still introduces metal-induced gap state (MIGS), leading to severe Fermi level pinning effects. Accordingly, the present invention proposes a metal-semiconductor contact structure based on 2D semimetal electrodes to solve the problems in the prior art.

SUMMARY

In view of the above problems, the present application provides a metal-semiconductor contact structure based on two-dimensional (2D) semimetal electrodes, which realizes a 2D potential barrier-free hole contact between a metal and a semiconductor using 2D semimetal electrodes, achieves a near-zero Schottky potential barrier height and a high tellurium nanosheet field-effect mobility, and promotes development of electrons and optoelectronics based on 2D semiconductors with a view to extending Moore's law.

The objectives of the present application are achieved by the following technical schemes:

a metal-semiconductor contact structure based on 2D semimetal electrodes, including a semiconductor module and a metal electrode module, where the semiconductor module is a 2D semiconductor material, and the metal electrode module is a 2D semimetal material with no dangling bonds on its surface; the 2D semiconductor material and the 2D semimetal material are interfaced with a Van der Waals interface with a surface roughness of 0.01-1 nanometer (nm) and no dangling bonds on the surface, the 2D semiconductor material and the 2D semimetal material are spaced less than 1 nm apart; the 2D semiconductor material is a 2D material, and the 2D semimetal material is an $MX_2$ 2D layered semimetal material.

Optionally, the above technical scheme is further improved to include one selected form a group of boron phosphide (BP), molybdenum ditelluride ($MoTe_2$), molybdenum disulfide ($MoS_2$), tungsten diselenide ($WSe_2$), molybdenum diselenide ($MoSe_2$) and tungsten disulphide ($WS_2$) as the 2D semiconductor material.

Optionally, in the $MX_2$ 2D layered semimetal material, M represents a transition metal and X refers to any chalcogen.

Optionally, the above technical scheme is further improved to include one selected from a group of 1T'-$MoTe_2$, 2H-niobium disulfide (2H—$NbS_2$), 1T'-tungsten ditelluride (1T'-$WT_2$), 1T'-tantalum disulfide (1T'-$TeSe_2$), 1T'-titanium disulfide (1T'-$TiS_2$), 1T-hafnium ditelluride (1T-$HfTe_2$), 1T-titanium ditelluride (1T-$TiTe_2$), 1T'-$WS_2$, platina ditelluride ($PtTe_2$) and vanadium diselenide ($VSe_2$) as the 2D layered semimetal material.

Optionally, the 2D semiconductor material is a doped 2D material, and the doped 2D material includes metal doping elements of molybdenum (Mo), tungsten (W), niobium (Nb), copper (Cu), aluminum (Al), gold (Au) and iron (Fe), and sulfur doping elements oxygen (O), sulphur (S), selenium (Se), tellurium (Te), nitrogen (N) and phosphorus (P).

Optionally, the 2D semiconductor material has a thickness of 0.1-20 nm and the 2D semimetal material has a thickness of 1-100 nm.

Optionally, the 2D semimetal material has a work function in a range of 4.0-6.0 electron volts (eV), and the 2D semimetal material creates, with electrodes, a hole Schottky potential barrier with a height of 0-30 million electron volts (meV).

Optionally, the Schottky potential barriers created by the electrodes of 2D semimetal material include electron and hole types.

Optionally, the 2D semiconductor material and the 2D semimetal material are prepared in a method selected from a combination of chemical vapor deposition, physical vapor deposition, chemical vapor transport, mechanical stripping and organic assisted methods.

The present application has the beneficial effects that the 2D semimetal material has a proper high work function to match the energy band edges of the semiconductor material and ultimately ensures a near-zero hole Schottky potential barrier, and its field-effect transistor shows a record high mobility at room temperature, with reduced hole Schottky potential barrier for full 2D contacts and optimized mechanism for reducing the Schottky potential barrier, so Schottky structures may be better designed and optimized based on 2D semiconductors.

BRIEF DESCRIPTION OF THE DRAWINGS

For a clearer description of the technical schemes in the embodiments of the present application or prior art, the drawings in the description of the embodiments or prior art are briefly described below; obviously the drawings in the description below are only some embodiments of the present application, and other drawings may be obtained based on these drawings by those of ordinary skill in the art without creative labor.

DETAILED DESCRIPTION OF THE EMBODIMENTS

Figure 1:
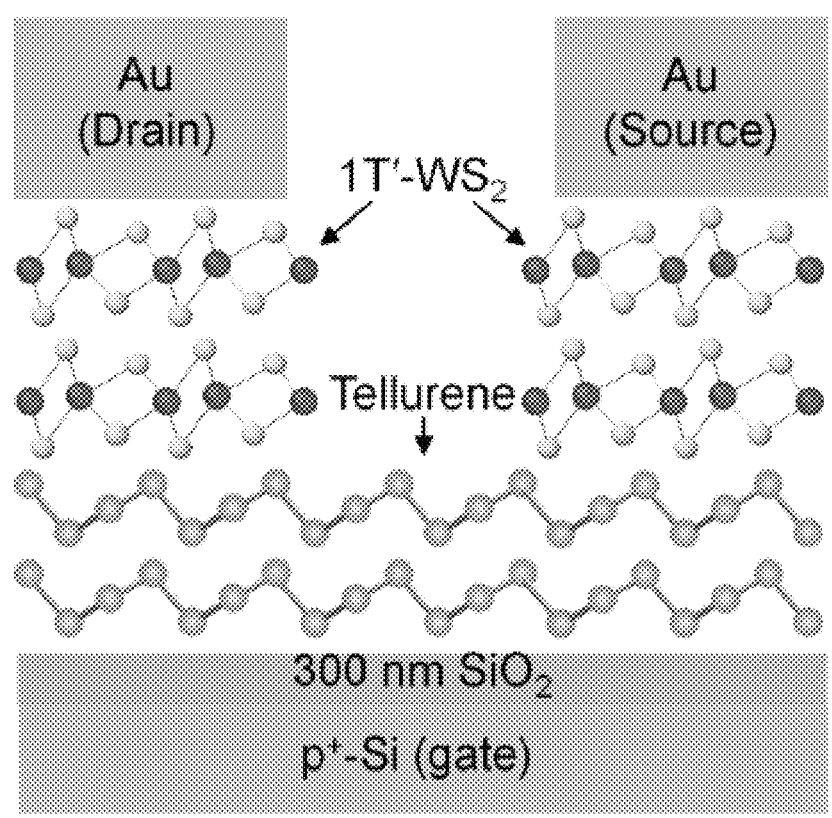
FIG. 1 is a schematic structural diagram of a semiconductor transistor with two-dimensional (2D) semimetal electrodes according to the present application.
Figure 2:
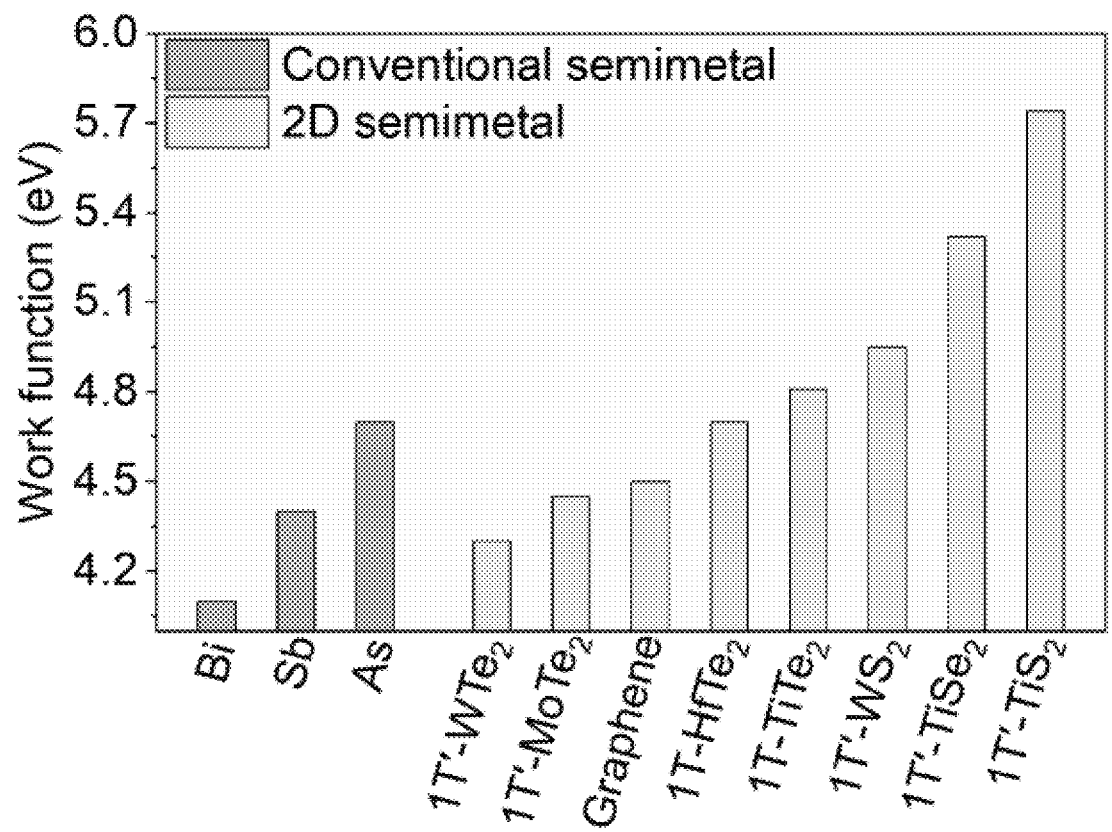
FIG. 2 is a statistical diagram illustrating work functions of conventional semimetal and 2D semimetal according to the present application.
Figure 3:
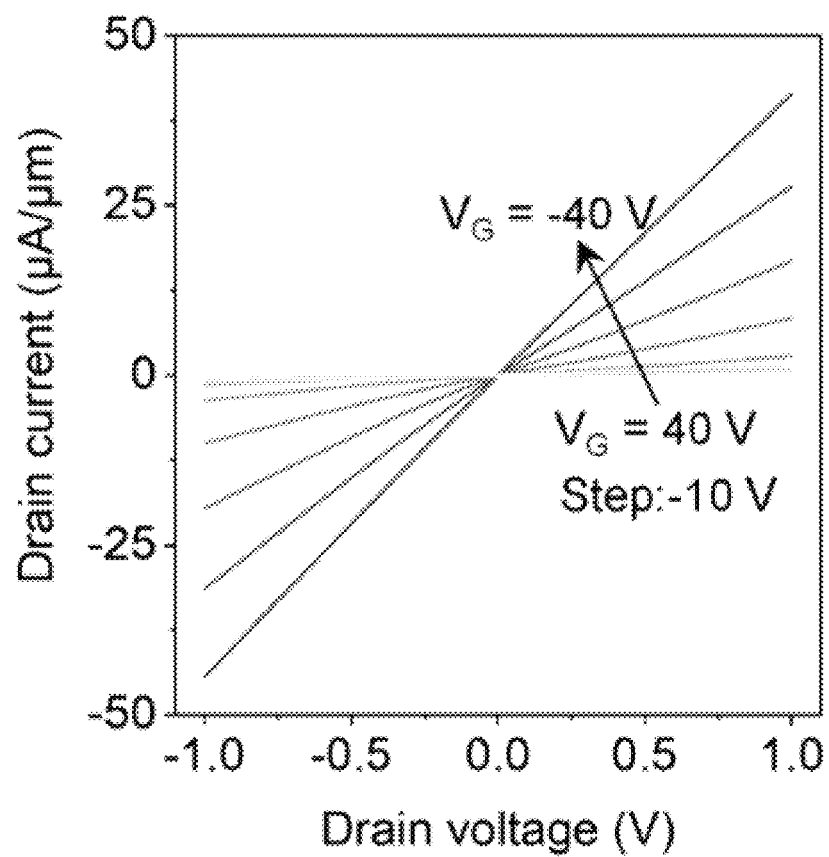
FIG. 3 is a diagram illustrating electrical performance of the 2D semimetal electrodes according to the present application.

The technical schemes in the embodiments of the present application will be clearly and completely described below with reference to the drawings in the embodiments of the present application. Obviously, the described embodiments are only part of the embodiments of the present application, but not all of them. Based on the embodiment of the present application, all other embodiments obtained by ordinary technicians in the field without creative labor are within the scope of the present application.

Embodiment 1

According to FIG. 1, FIG. 2, FIG. 3 and FIG. 4A—FIG. 4B, the present embodiment provides a metal-semiconductor contact structure based on two-dimensional (2D) semimetal electrodes, including a semiconductor module and a metal electrode module; where the semiconductor module is a 2D semiconductor material, and the metal electrode module is a 2D semimetal material with no dangling bonds on its surface; the 2D semimetal material is a 2D layered semimetal material possessing a unique electronic structure of Dirac cones, thereby suppressing a Fermi level pinning effect; the 2D semiconductor material and the 2D semimetal material are interfaced with a Van der Waals interface with a surface roughness of 0.01-1 nanometer (nm) and no dangling bonds on the surface, the 2D semiconductor material and the 2D semimetal material are spaced less than 1 nm apart; the 2D semiconductor material is a 2D material, and the 2D semimetal material is an $MX_2$ 2D layered semimetal material.

The 2D semiconductor material is one selected form a group of boron phosphide (BP), molybdenum ditelluride ($MoTe_2$), molybdenum disulfide ($MoS_2$), tungsten diselenide ($WSe_2$), molybdenum diselenide ($MoSe_2$) and tungsten disulphide ($WS_2$); the $MX_2$ 2D layered semimetal material includes M as transition metal and X referring to any chalcogen; and the 2D layered semimetal material is one selected from a group of 1T'-$MoTe_2$, 2H-niobium disulfide (2H—$NbS_2$), 1T'-tungsten ditelluride (1T'-$WTe_2$), 1T'-tantalum disulfide (1T'-$TeSe_2$), 1T'-titanium disulfide (1T'-$TiS_2$), 1T-hafnium ditelluride (1T-$HfTe_2$), 1T-titanium ditelluride (1T-$TiTe_2$), 1T'-$WS_2$, platina ditelluride ($PtTe_2$) and vanadium diselenide ($VSe_2$).

The 2D semiconductor material is a doped 2D material, and the doped 2D material includes metal doping elements of molybdenum (Mo), tungsten (W), niobium (Nb), copper (Cu), aluminum (Al), gold (Au) and iron (Fe), and sulfur doping elements oxygen (O), sulphur (S), selenium (Se), tellurium (Te), nitrogen (N) and phosphorus (P).

The 2D semiconductor material has a thickness of 0.1-20 nm and the 2D semimetal material has a thickness of 1-100 nm.

The 2D semimetal material has a work function in a range of 4.0-6.0 electron volts (eV), indicating that zero Schottky potential barrier can be achieved at the interface between the 2D semiconductor material and the 2D semimetal material using a 2D semimetal material with a large work function as well as a Van der Waals surface with no dangling bonds; and the 2D semimetal material creates, with electrodes, a hole Schottky potential barrier with a height of 0-30 million electron volts (meV), where 2D semimetal materials are used instead of conventional metals to create a Schottky potential barrier-free hole for high-quality metal-semiconductor contacts, and the Schottky potential barriers created by electrodes of 2D semimetal material include electron and hole types.

The 2D semiconductor material and the 2D semimetal material are prepared in a method selected from a combination of chemical vapor deposition, physical vapor deposition, chemical vapor transport, mechanical stripping and organic assisted methods.

Embodiment 2

Figure 4A:
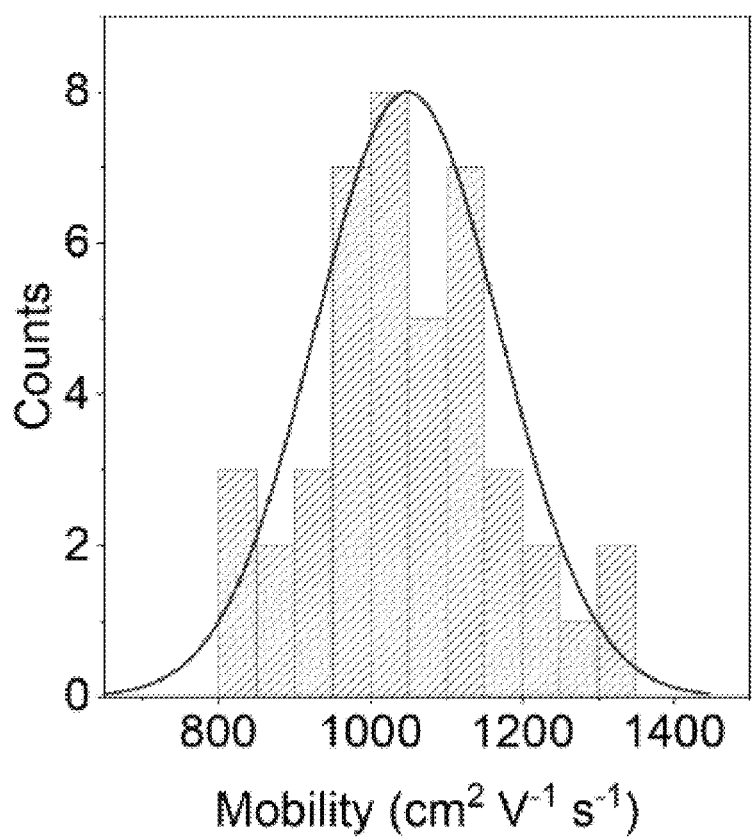
FIG. 4A-FIG. 4B are statistical diagrams showing mobility and $I_{on}/I_{off}$ ratio of semiconductor transistor with 2D semimetal electrodes according to the present application.
Figure 4B:
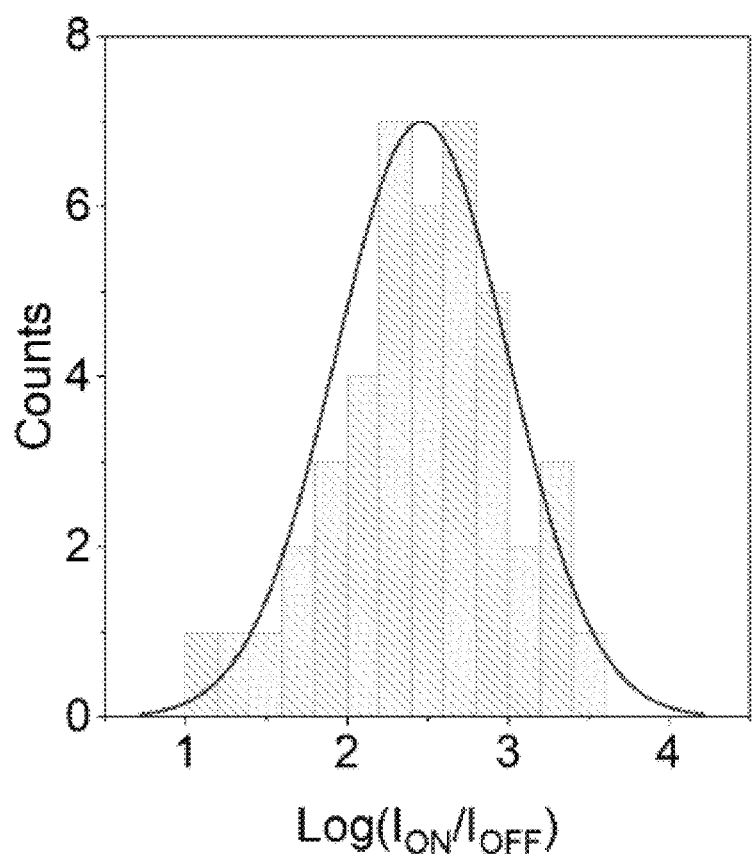

The present embodiment provides a metal-semiconductor contact structure based on 2D semimetal electrodes with reference to FIG. 1, FIG. 2, FIG. 3 and FIG. 4A—FIG. 4B, where the metal-semiconductor contact structure includes a 2D semimetal material 1T'-$WS_2$ and a 2D semiconductor material telluride nano-sheet. The 2D semimetal material 1T'-$WS_2$ has two adjacent layers that are stacked by weak Van der Waals coupling, with atoms in the interface being connected by strong covalent bonds; the crystal has an asymmetric structure with strong anisotropy, and the semimetal properties have also been demonstrated systematically. By precisely transferring electrodes of the 2D semimetal material 1T'-$WS_2$, a 2D semiconductor material tellurene nanosheet field-effect transistor (FET) is successfully constructed, where the 2D semiconductor material tellurene nanosheet FET with symmetric 2D semimetal material 1T'-$WS_2$ electrodes has schematic structure as shown in FIG. 1 attached to the specification; from FIG. 3, it can be seen that the FET shows excellent linear ohmic contact, indicating a small Schottky potential barrier between the 2D semimetal material 1T'-$WS_2$ electrodes of the 2D semiconductor material tellurene nanosheets at room temperature; the FET of the present embodiment also has a reported highest performance in terms of mobility; as shown in FIG. 4A and FIG. 4B, through data analysis of dozens of devices, the hole mobility and $I_{ON}/I_{OFF}$ ratio indicate that the 2D semiconductor material tellurene nanosheet FET has excellent performance.

The above embodiments of the present application provide a detailed description of the high-quality metal-semiconductor contact structure based on the 2D semimetal electrodes. The above description of the embodiments is only used to help understand the methods and core idea of this application; moreover, changes may be made in the specific implementation and application scope based on the spirit of this application for a person of ordinary skill in the art, and in summary, the content of this specification should not be understood as a limitation to this application.

The above shows and describes the basic principle, main features and advantages of the present application. It should be understood by those skilled in the art that the present application is not limited by the above-mentioned embodiments. The above-mentioned embodiments and descriptions only illustrate the principles of the present application. Without departing from the spirit and scope of the present application, there will be various changes and improvements of the present application, all of which shall fall within the scope of the application. The scope of that present application is defined by the appended claims and their equivalents.

What is claimed is:

1. A metal-semiconductor contact structure based on two-dimensional (2D) semimetal electrodes, comprising a semiconductor module and a metal electrode module; wherein the semiconductor module is a 2D semiconductor material, and the metal electrode module is a 2D semimetal material with no dangling bonds on a surface; the 2D semiconductor material and the 2D semimetal material are interfaced with a Van der Waals interface with a surface roughness of 0.01-1 nanometer (nm) and no dangling bonds on the surface, the 2D semiconductor material and the 2D semimetal material are spaced less than 1 nm apart; the 2D semiconductor material is a 2D material, and the 2D semimetal material is an $MX_2$ 2D layered semimetal material; the 2D semiconductor material has a thickness of 0.1-20 nm and the 2D semimetal material has a thickness of 1-100 nm; the 2D semimetal material has a work function in a range of 4.0-6.0 electron volts (eV), and the 2D semimetal material creates, with electrodes, a hole Schottky potential barrier with a height of 0-30 million electron volts (meV); the electrodes of 2D semimetal material create Schottky potential barrier comprising electron and hole types; and the 2D semiconductor material and the 2D semimetal material are prepared in a method selected from a combination of chemical vapor deposition, physical vapor deposition, chemical vapor transport, mechanical stripping and organic assisted methods;

the 2D semiconductor material is one selected form a group of boron phosphide (BP), molybdenum ditelluride ($MoTe_2$), molybdenum disulfide ($MoS_2$), tungsten diselenide ($WSe_2$), molybdenum diselenide ($MoSe_2$) and tungsten disulphide ($WS_2$);

in the $MX_2$ 2D layered semimetal material, M represents a transition metal and X refers to any chalcogen;

the 2D layered semimetal material is one selected from a group of 1T'-$MoTe_2$, 2H-niobium disulfide (2H-$NbS_2$), 1T'-tungsten ditelluride (1T'-$WTe_2$), 1T'-tantalum disulfide (1T'-$TeSe_2$), 1T'-titanium disulfide (1T'-$TiS_2$), 1T-hafnium ditelluride (1T-$HfTe_2$), 1T-titanium ditelluride (1T-$TiTe_2$), 1T'-$WS_2$, platina ditelluride ($PtTe_2$) and vanadium diselenide ($VSe_2$); and the 2D semiconductor material is a doped 2D material, and the doped 2D material comprises metal doping elements of molybdenum (Mo), tungsten (W), niobium (Nb), copper (Cu), aluminum (Al), gold (Au) and iron (Fe), and sulfur doping elements of oxygen (O), sulphur (S), selenium (Se), tellurium (Te), nitrogen (N) and phosphorus (P).

* * * * *